United States Patent
Lou

Patent Number: 6,143,605
Date of Patent: *Nov. 7, 2000

[54] METHOD FOR MAKING A DRAM CAPACITOR USING A DOUBLE LAYER OF INSITU DOPED POLYSILICON AND UNDOPED AMORPHOUS POLYSILICON WITH HSG POLYSILICON

[75] Inventor: Chine-Gie Lou, Hsinchu Hsien, Taiwan

[73] Assignee: Worldwide Semiconductor Manufacturing Corporation, Hsinchu, Taiwan

[*] Notice: This patent is subject to a terminal disclaimer.

[21] Appl. No.: 09/041,863

[22] Filed: Mar. 12, 1998

[51] Int. Cl.[7] ............................................. H01L 21/8242
[52] U.S. Cl. .................................... 438/255; 438/398
[58] Field of Search .................................. 438/238, 239, 438/253–256, 381, 396–399

[56] References Cited

U.S. PATENT DOCUMENTS 5,591,664  1/1997  Wang et al. ............................ 437/60
5,639,685  6/1997  Zahurak et al. ........................ 437/60
5,827,766  10/1998  Lou ...................................... 438/253

*Primary Examiner*—Joni Chang
*Attorney, Agent, or Firm*—Blakely Sokoloff Taylor & Zafman

[57] ABSTRACT

A method of making a capacitor over a contact. The method comprises the steps of: (a) depositing an oxide layer over said contact; (b) forming a dual damascene opening in said oxide layer over said contact; (c) depositing a layer of insitu doped polysilicon over said dual damascene opening and said oxide layer; (d) depositing a layer of undoped amorphous polysilicon over said layer of insitu doped polysilicon; (e) removing said layer of undoped amorphous polysilicon and said layer of insitu doped polysilicon that is outside of said dual damascene opening; (f) removing said oxide layer to leave a dual damascene structure comprising insitu doped polysilicon and undoped amorphous polysilicon; (g) forming hemispherical grain (HSG) polysilicon on the surface of said dual damascene structure; (h) forming a dielectric layer over said dual damascene structure; and (i) forming a top electrode over said dielectric layer.

19 Claims, 3 Drawing Sheets

METHOD FOR MAKING A DRAM CAPACITOR USING A DOUBLE LAYER OF INSITU DOPED POLYSILICON AND UNDOPED AMORPHOUS POLYSILICON WITH HSG POLYSILICON

TECHNICAL FIELD OF THE INVENTION

This invention relates to semiconductor memories, and more particularly, to an improved method for making a cylindrical DRAM capacitor.

BACKGROUND OF THE INVENTION

It has been a recent trend in dynamic random access memory (DRAM) to increase the density of DRAM integrated circuits. However, as higher density DRAM cells are developed, the area available for capacitors that are used in the DRAM cells decreases. In order to decrease the area of capacitors while maintaining reliability standards, it is important to be able to maintain the capacitance of each capacitor while decreasing its footprint. Recently, capacitors having a three-dimensional structure have been suggested to increase cell capacitance. Such capacitors include, for example, double-stacked, fin-structured, cylindrical, spread-stacked, and box structured capacitors.

There is also a challenge to develop methods of manufacturing these capacitors that minimize the manufacturing costs and provide maximum process tolerance to maximize product yields. The present invention is directed to such an improved capacitor.

SUMMARY OF THE INVENTION

A method of making a capacitor over a contact is disclosed. The method comprises the steps of: (a) depositing an oxide layer over said contact; (b) forming a dual damascene opening in said oxide layer over said contact; (c) depositing a layer of insitu doped polysilicon over said dual damascene opening and said oxide layer; (d) depositing a layer of undoped amorphous polysilicon over said layer of insitu doped polysilicon; (e) removing said layer of undoped amorphous polysilicon and said layer of insitu doped polysilicon that is outside of said dual damascene opening; (f) removing said oxide layer to leave a dual damascene structure comprising insitu doped polysilicon and undoped amorphous polysilicon; (g) forming hemispherical grain (HSG) polysilicon on the surface of said dual damascene structure; (h) forming a dielectric layer over said dual damascene structure; and (i) forming a top electrode over said dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention will be described in detail with reference to the accompanying drawings. The present invention provides a method of forming a DRAM having a cylindrical capacitor which has high capacitance, and is simple to manufacture.

Figure 1:
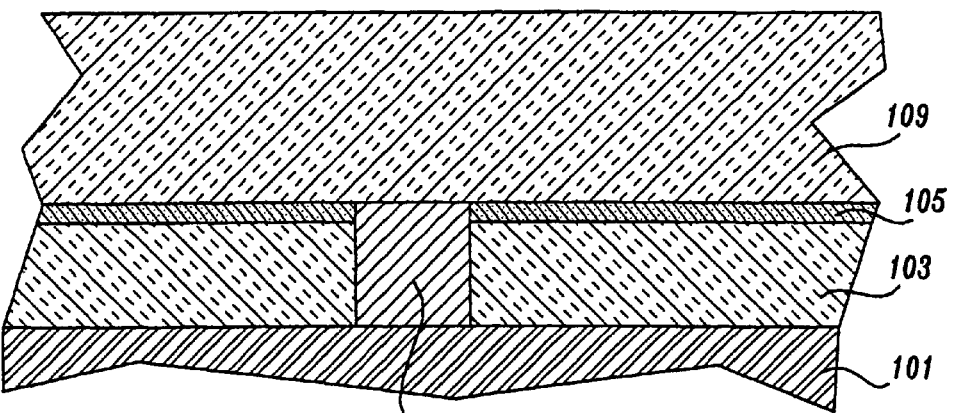
FIGS. 1–7 are cross-sectional views of a semiconductor substrate illustrating the steps of the present invention for forming a cylindrical capacitor.

Turning to FIG. 1, a semiconductor substrate 101 is shown. The substrate is understood to possibly include a semiconductor wafer, active and passive devices formed within the wafer, and layers formed on the wafer's surface. The term "substrate" is meant to include devices formed within a semiconductor wafer and the layers overlying the wafer. The term "substrate surface" is meant to include the uppermost exposed layers on a semiconductor wafer, such as a silicon surface, an insulating layer, and metal lines.

In FIG. 1, an insulating layer 103 is formed atop the substrate 101. Next, a barrier layer 105 is formed atop the insulating layer 103. Preferably, the barrier layer 105 is composed of silicon nitride. Next, a contact opening is made using conventional masking and etching techniques into the barrier layer 105 and insulating layer 103 down to the substrate 101. The opening is then filled with a conductive material forming a plug 107. Such a conductive material includes, for example, insitu doped polysilicon, tungsten, or aluminum. In the preferred embodiment, the plug is filled with tungsten. Typically, the plug 107 is formed by depositing a layer of tungsten over the entire barrier layer 105 and into the opening. Next, either a chemical mechanical polishing process or a reactive ion etching process may be used to remove that portion of the tungsten layer that remains above the barrier layer 105.

Next, a second insulating layer 109 is deposited over the barrier layer 105 and the tungsten plug 107. Preferably, the second insulating layer 109 is comprised of an oxide.

Figure 2:
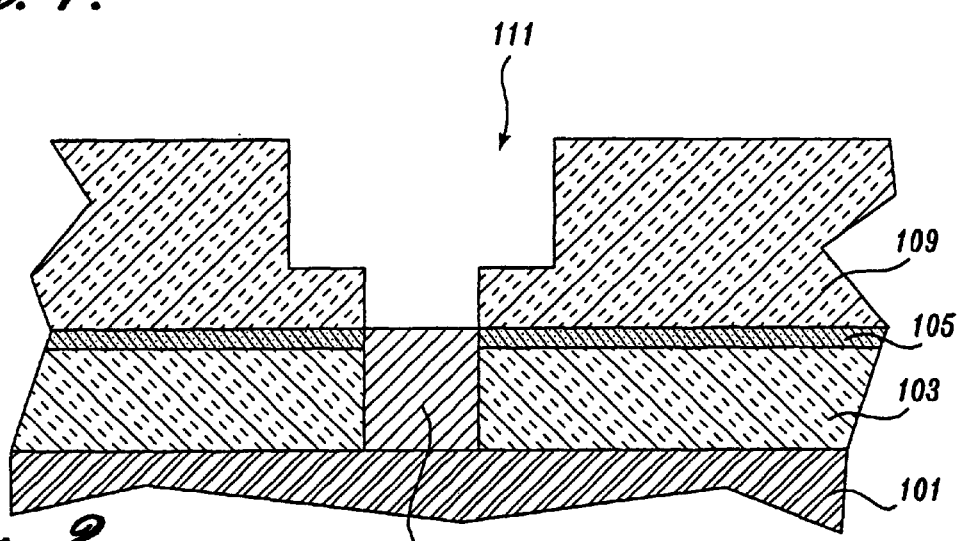

Next, turning to FIG. 2, a dual damascene opening 111 is formed in the second insulating layer 109 down to meet the surface of the tungsten plug 107. As can be appreciated by those skilled in the art, a "dual damascene" structure is one that is well-known in the art and relates to a stairstep opening. Note that the dual damascene opening 111 of FIG. 2 is preferably of cylindrical shape although may be formed into any shape.

The dual damascene opening 111 may be formed in any one of many conventional methods. The first and conceptually simplest method is to use two photoresist masks. The first mask will be used to partially etch the second insulating layer 109. The second mask will be of narrower dimension than the first mask and will be used to etch the remaining insulating layer 109 until the tungsten plug 107 is reached. It can be appreciated that these masking steps may be reversed. Thus, the first mask will have an opening equal to the opening of the lower stairstep level of the dual damascene opening 111. The second insulating layer 109 is etched all the way through to the tungsten plug 107. Next, a second mask is applied to the second insulating layer 109 prior to a second etching step. The second mask has an opening that is equivalent to the upper width of the dual damascene opening 111.

It can be appreciated that there are other methods of making the dual damascene opening 111, such as the use of a half-tone optical mask, or the use of multiple thickness photoresist layers. However, the precise method to make the dual damascene opening 111 is not crucial to the present invention and will not be further described herein.

Figure 3:
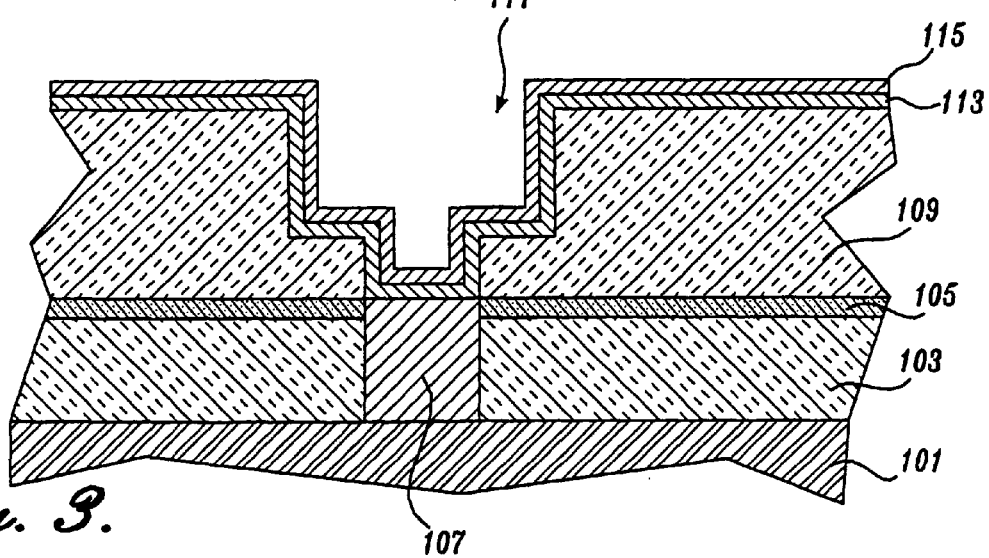

Next, after the dual damascene opening 111 has been formed in the second insulating layer 109 (referred to hereafter as oxide layer 109) and over the tungsten plug 107, as seen in FIG. 3, a sequential deposition of a first layer of insitu doped polysilicon 113 followed by a layer of undoped amorphous polysilicon 115 is performed. The first in-situ doped polysilicon layer 113 may be deposited using any conventional technique. For example, a CVD process using phosphine ($PH_3$) and silane ($SiH_4$) as the reactant gases may be used. Preferably, the in-situ doped polysilicon layer has a thickness of between 500 and 3000 angstroms. A deposition temperature of the in-situ doped polysilicon is preferably between 500° and 540° C.

Next, the undoped amorphous polysilicon layer 115 is deposited over the top of the in-situ doped polysilicon 113. Note that the undoped amorphous polysilicon layer 115 may be deposited in the same CVD reaction chamber as the insitu doped polysilicon. The undoped amorphous polysilicon layer 115 may be deposited using any known conventional technique, such as the use of silane as the reactant gas. In essence, a single process run is used to deposit both the in-situ doped polysilicon layer 113 and the undoped amorphous polysilicon layer 115. Preferably, the thickness of the undoped amorphous polysilicon layer 115 is between 300 and 800 angstroms. A deposition temperature of the undoped amorphous polysilicon is preferably between 470° and 530° C.

Figure 4:
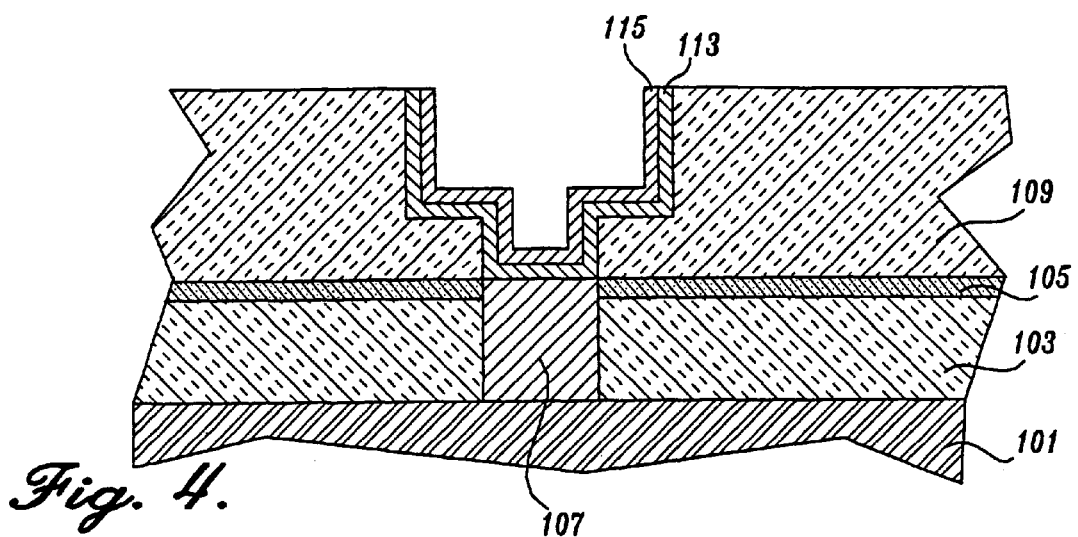

Next, the portions of the undoped amorphous polysilicon layer 115 and the in-situ doped polysilicon layer 113 that are not within the dual damascene opening 111 are removed using chemical mechanical polishing (CMP). The resultant structure is seen in FIG. 4.

Figure 5:
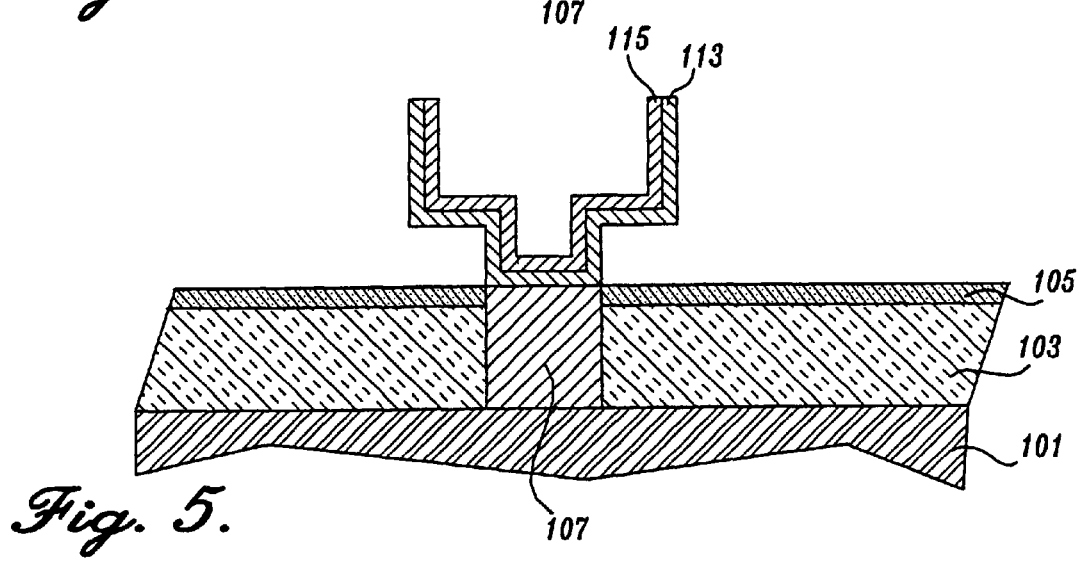

Next, turning to FIG. 5, a wet etch is used to remove the oxide layer 109. The barrier layer 105 is used as an etching stop. The resultant structure is a crown or cylindrical shaped bottom electrode node of a capacitor. Note that the outer surface of the cylinder is in-situ doped polysilicon, while the inner surface of the cylinder is undoped amorphous polysilicon.

Figure 6:
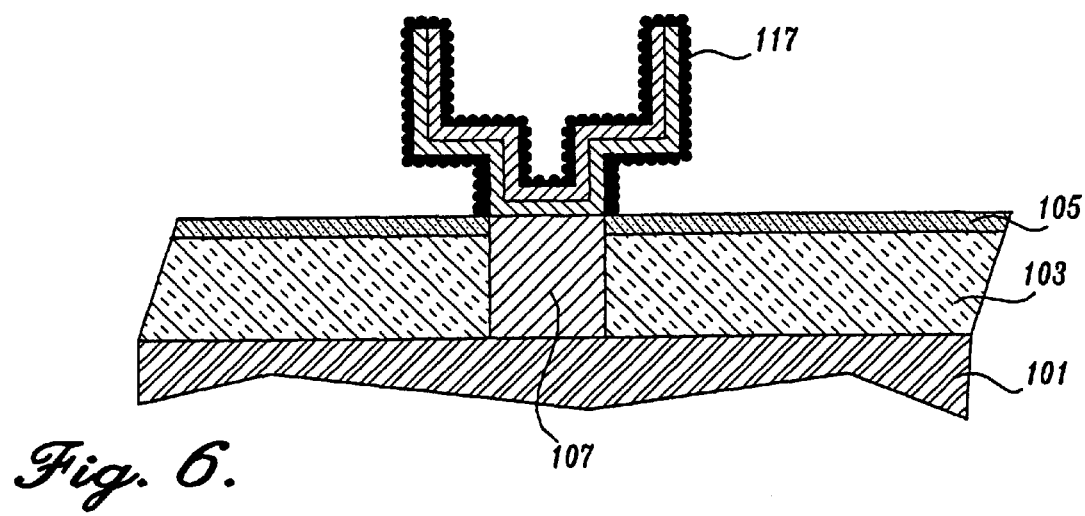

In the next step shown in FIG. 6, hemispherical grain (HSG) polysilicon 117 is formed on the surface of the entire cylinder by a high vacuum anneal. An anneal temperature of the high vacuum is preferably between 560° and 660° C. As is known in the art, HSG polysilicon is used to increase the surface area of a capacitor plate. However, it has been found by the present inventor that the area gain caused by the formation of HSG polysilicon differs depending upon the surface upon which it is formed. In the case of formation upon in-situ doped polysilicon, the area gain is a factor of more than two. However, it has been found that formation upon undoped amorphous polysilicon provides an area gain of more than three.

In the preferred embodiment, the HSG polysilicon is formed using a seeding and high vacuum technique. In summary, silane ($SiH_4$) or di-silane ($Si_2H_6$) is used to seed the surface of the amorphous polysilicon. Next, the HSG polysilicon is formed in a high vacuum. The advantage of this preferred method is to only form the HSG polysilicon on the surface of the amorphous polysilicon. In contrast, the deposition and etchback method of forming HSG polysilicon requires the additional etchback step, further increasing cost and complexity.

Figure 7:
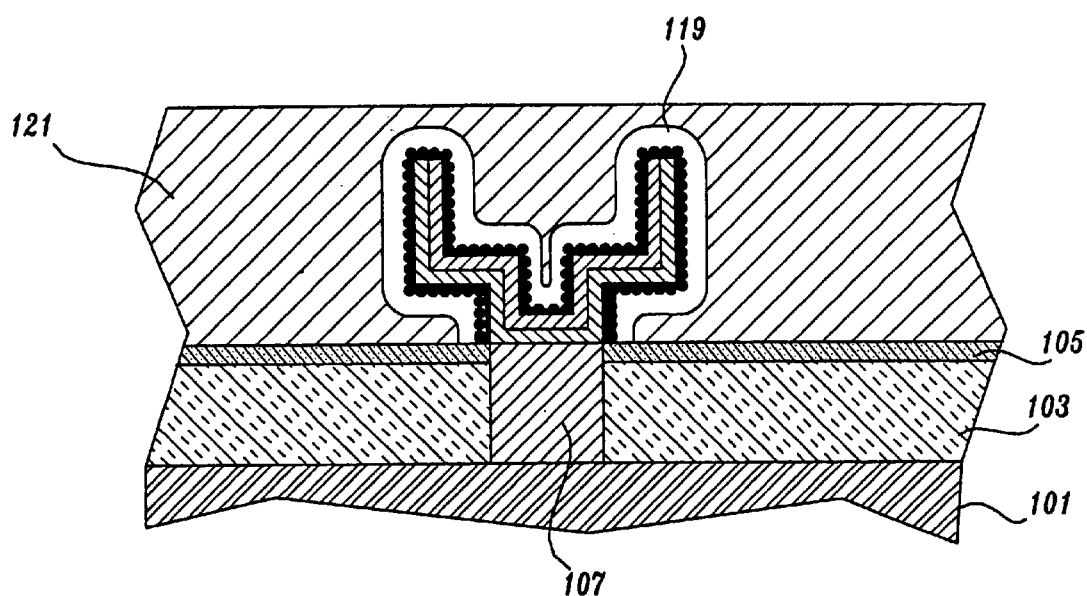

Next as seen in FIG. 7, conventional techniques are used to form a dielectric layer 119 over the cylindrical bottom electrode. The dielectric layer 119 is preferably a composite layer of oxide/nitride/oxide (ONO). Importantly, during the formation of the ONO layer, the relatively high temperature needed to oxidize the nitride will cause the dopants from the insitu doped polysilicon to diffuse into the undoped amorphous polysilicon. This will cause the undoped amorphous polysilicon to become conducting doped polysilicon. Thus, the entire bottom electrode of the cylinder is conductive.

Finally, to complete the formation of the capacitor, the top electrode of the capacitor is formed over the dielectric layer 119. Preferably, the top electrode is a second layer of insitu doped polysilicon 121. Moreover, the capacitor of the present invention is commonly used in DRAM cells as the capacitor over bitline (COB). Thus, the tungsten plug 107 is connected to an underlying MOSFET formed in the semiconductor substrate 101.

While the preferred embodiment of the invention has been illustrated and described, it will be appreciated that various changes can be made therein without departing from the spirit and scope of the invention. For example, although the detailed description uses the example of a cylindrical shaped capacitor, the capacitor may be box shaped so that the capacitor appears as a rectangle from the top view.

The embodiments of the invention in which an exclusive property or privilege is claimed are defined as follows:

1. A method of forming a bottom electrode node of a DRAM capacitor over a contact, the method comprising the steps of:

(a) depositing an oxide over said contact;

(b) forming a dual damascene opening in said oxide over said contact;

(c) depositing a layer of insitu doped polysilicon over said dual damascene opening;

(d) depositing a layer of undoped amorphous polysilicon over said layer of insitu doped polysilicon;

(e) removing said oxide layer to leave a dual damascene structure comprising insitu doped polysilicon and undoped amorphous polysilicon; and (f) forming hemispherical grain (HSG) polysilicon on a surface of said dual damascene structure.

2. The method of claim 1 wherein said step of depositing said insitu doped polysilicon and said step of depositing said undoped amorphous polysilicon is performed in the same reaction chamber.

3. The method of claim 1 further including the step of chemical mechanical polishing said layer of undoped amorphous polysilicon and said insitu doped polysilicon until said oxide layer is reached outside of said dual damascene opening.

4. The method of claim 1 further including the step of forming a dielectric layer over said dual damascene structure and depositing a layer of doped polysilicon over said dielectric layer to act as a top electrode of said DRAM capacitor.

5. The method of claim 1 wherein said step of depositing said insitu doped polysilicon is performed at a temperature of 500° to 540° C.

6. The method of claim 1 wherein said step of depositing said undoped amorphous polysilicon is performed at a temperature of 470° to 530° C.

7. The method of claim 1 wherein said HSG polysilicon is formed using a seeding and high vacuum method on said amorphous polysilicon layer.

8. The method of claim 2 wherein said HSG polysilicon is formed using a seeding and high vacuum method on said amorphous polysilicon layer.

9. The method of claim 3 wherein said HSG polysilicon is formed using a seeding and high vacuum method on said amorphous polysilicon layer.

10. A method of making a capacitor over a contact, the method comprising the steps of:

(a) depositing an oxide layer over said contact;

(b) forming a dual damascene opening in said oxide layer over said contact;

(c) depositing a layer of insitu doped polysilicon over said dual damascene opening and said oxide layer;

(d) depositing a layer of undoped amorphous polysilicon over said layer of insitu doped polysilicon;

(e) removing said layer of undoped amorphous polysilicon and said layer of insitu doped polysilicon that is outside of said dual damascene opening;

(f) removing said oxide layer to leave a dual damascene structure comprising insitu doped polysilicon and undoped amorphous polysilicon;

(g) forming hemispherical grain (HSG) polysilicon on a surface of said dual damascene structure;

(h) forming a dielectric layer over said dual damascene structure; and (i) forming a top electrode over said dielectric layer.

11. The method of claim 10 wherein step (e) is done by chemical mechanical polishing.

12. The method of claim 11 wherein said step of depositing said insitu doped polysilicon and said step of depositing said undoped amorphous polysilicon is performed in a same reaction chamber.

13. The method of claim 10 wherein said dielectric layer is a composite layer of ONO and further that during the step of forming said ONO layer, dopants in said layer of insitu doped polysilicon diffuse to said layer of undoped amorphous polysilicon.

14. The method of claim 11 wherein said dielectric layer is a composite layer of ONO and further that during the step of forming said ONO layer, dopants in said layer of insitu doped polysilicon diffuse to said layer of undoped amorphous polysilicon.

15. The method of claim 12 wherein said dielectric layer is a composite layer of ONO and further that during the step of forming said ONO layer, dopants in said layer of insitu doped polysilicon diffuse to said layer of undoped amorphous polysilicon.

16. The method of claim 10 wherein said step of depositing said insitu doped polysilicon is performed at a temperature of 500° to 540° C.

17. The method of claim 10 wherein said step of depositing said undoped amorphous polysilicon is performed at a temperature of 470° to 530° C.

18. The method of claim 10 wherein said HSG polysilicon is formed using a seeding and high vacuum method on said amorphous polysilicon layer.

19. The method of claim 18 wherein said step of forming said HSG polysilicon is performed at a temperature of 560° to 660° C.

* * * * *